(12) United States Patent
Lee

(10) Patent No.: US 10,642,082 B2
(45) Date of Patent: May 5, 2020

(54) CURVED LCD DISPLAY DEVICE

(71) Applicant: A.U. Vista, Inc., Irvine, CA (US)

(72) Inventor: Seok-Lyul Lee, Hsinchu (TW)

(73) Assignee: A.U. Vista, Inc., Irvine, CA (US)

( * ) Notice: Subject to any disclaimer, the term of this patent is extended or adjusted under 35 U.S.C. 154(b) by 63 days.

(21) Appl. No.: 15/828,720

(22) Filed: Dec. 1, 2017

(65) Prior Publication Data

US 2019/0171059 A1     Jun. 6, 2019

(51) Int. Cl.
*G02F 1/1333* (2006.01)
*G02F 1/1335* (2006.01)
*H01L 27/12* (2006.01)

(52) U.S. Cl.
CPC ...... *G02F 1/133308* (2013.01); *G02F 1/1333* (2013.01); *G02F 1/133512* (2013.01); *G02F 1/133514* (2013.01); *G02F 1/133553* (2013.01); *G02F 2001/133565* (2013.01); *H01L 27/1214* (2013.01)

(58) Field of Classification Search
CPC ................................................ G02F 1/133308
See application file for complete search history.

(56) References Cited

U.S. PATENT DOCUMENTS

| | | | |
|---|---|---|---|
| 7,038,751 B2 | 5/2006 | Lee | |
| 7,872,414 B2 | 1/2011 | Sugita et al. | |
| 2003/0164679 A1* | 9/2003 | Hamano | H01L 51/5271 |
| | | | 313/504 |
| 2004/0075798 A1* | 4/2004 | Inoue | G02F 1/133707 |
| | | | 349/129 |
| 2006/0114378 A1* | 6/2006 | Choi | G02F 1/1395 |
| | | | 349/110 |
| 2011/0090442 A1* | 4/2011 | Koma | G02F 1/133371 |
| | | | 349/123 |
| 2011/0316764 A1* | 12/2011 | Parry-Jones | G02B 26/005 |
| | | | 345/60 |
| 2012/0008191 A1 | 1/2012 | Lim et al. | |
| 2013/0176725 A1* | 7/2013 | Hajjar | H04N 9/3129 |
| | | | 362/231 |
| 2016/0223855 A1* | 8/2016 | Kobayashi | G02F 1/136286 |
| 2017/0263691 A1* | 9/2017 | Seo | G02F 1/133504 |
| 2017/0277000 A1* | 9/2017 | Shi | G02F 1/133553 |
| 2018/0095305 A1* | 4/2018 | Chae | G02F 1/133514 |
| 2019/0103063 A1* | 4/2019 | Liu | G09G 3/36 |

FOREIGN PATENT DOCUMENTS

CN     107608114    *  1/2018   ......... G02F 1/1333

* cited by examiner

*Primary Examiner* — Sang V Nguyen
(74) *Attorney, Agent, or Firm* — Ware, Fressola, Maguire & Barber LLP

(57) ABSTRACT

A liquid crystal display has a plurality of light directing elements located between the CF substrate and the TFT substrate. The TFT substrate has a plurality of pixel areas and a plurality of bordering areas between adjacent pixel areas. The CF substrate has a plurality of apertures corresponding to the pixel areas and a plurality of masking elements between adjacent aperture areas. Each of the masking elements is broader than the corresponding bordering area on the TFT substrate. The light directing elements with reflective surfaces are used to condense part of the light beam transmitted through a pixel area so as to reduce the beam width of the light beam as it reaches the corresponding aperture. The light directing elements can be located on the CF substrate or the TFT substrate.

20 Claims, 14 Drawing Sheets

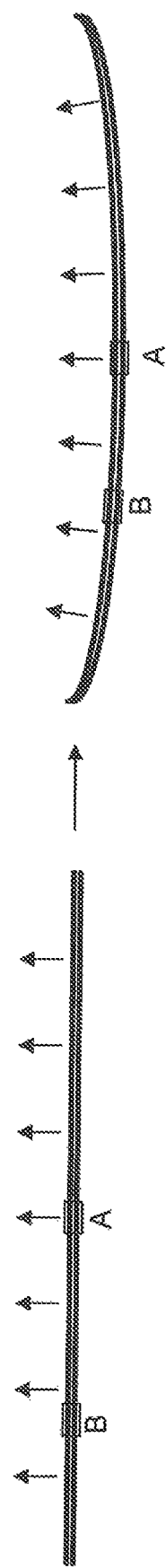

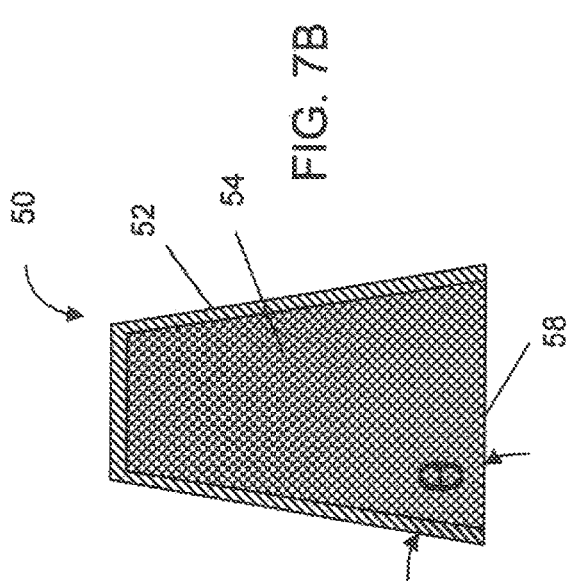
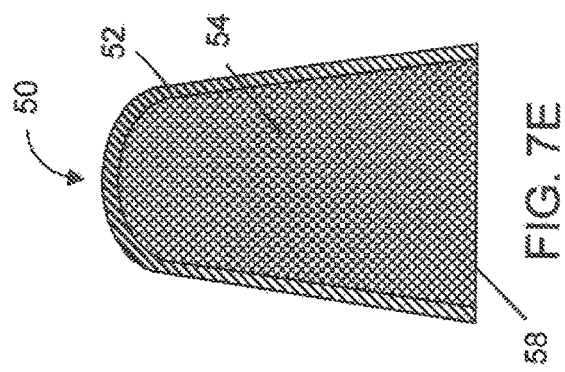
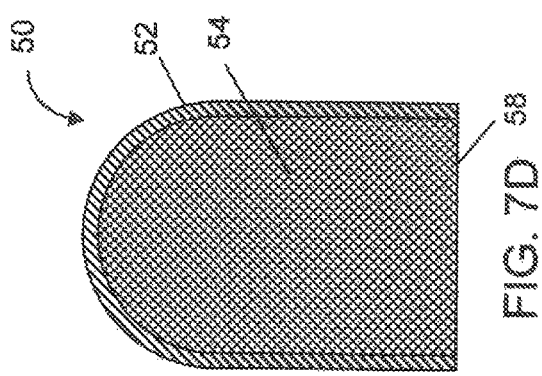
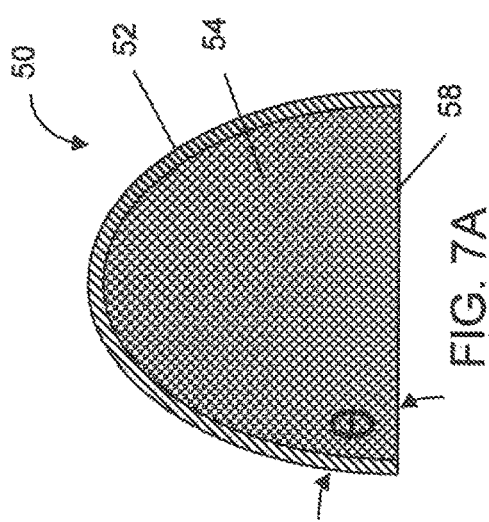
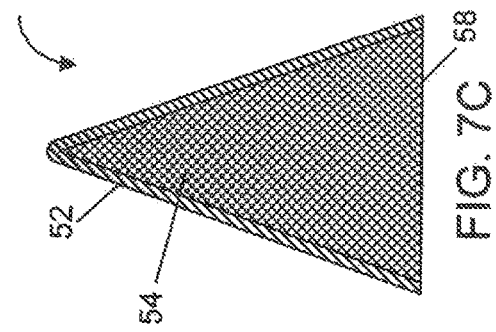

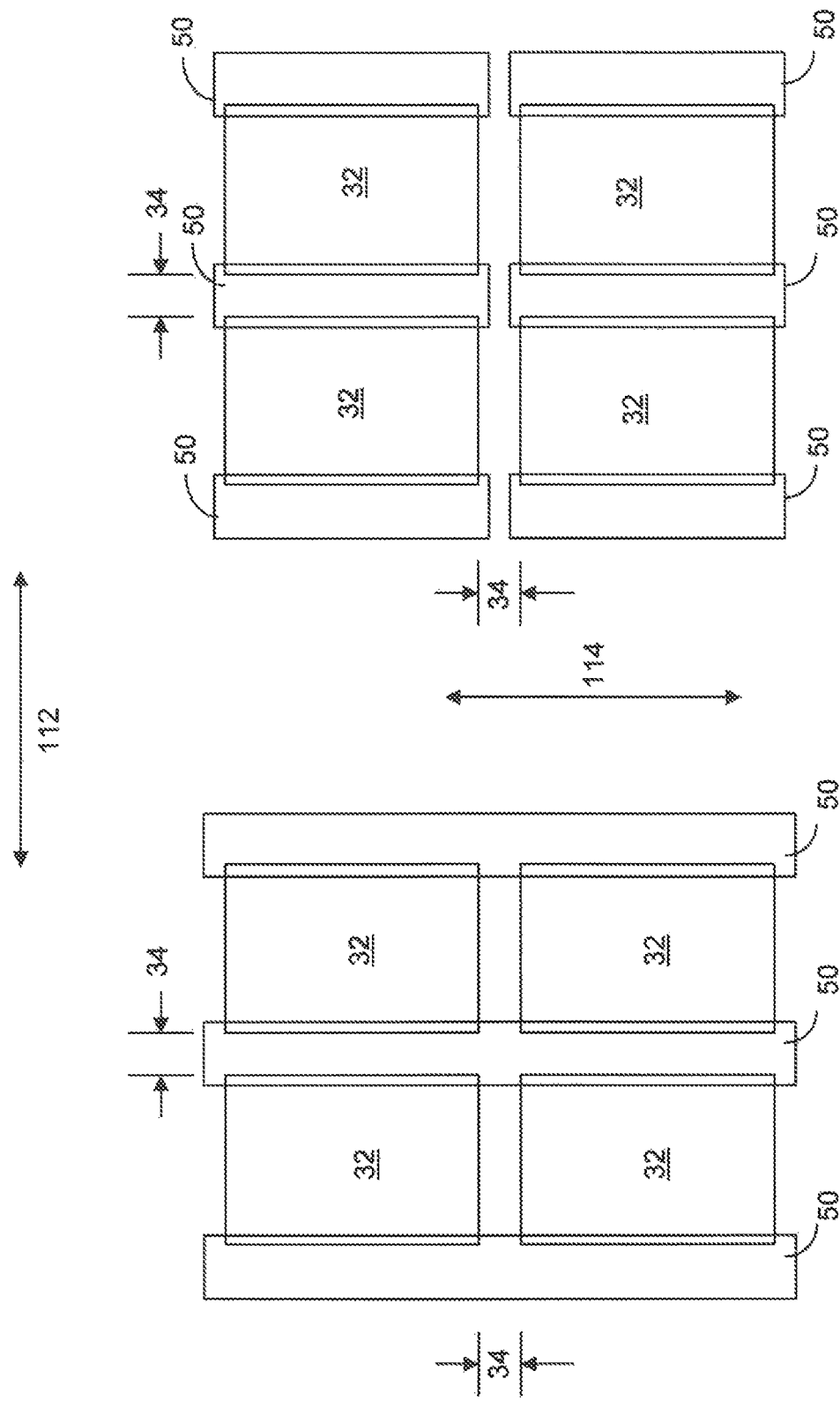

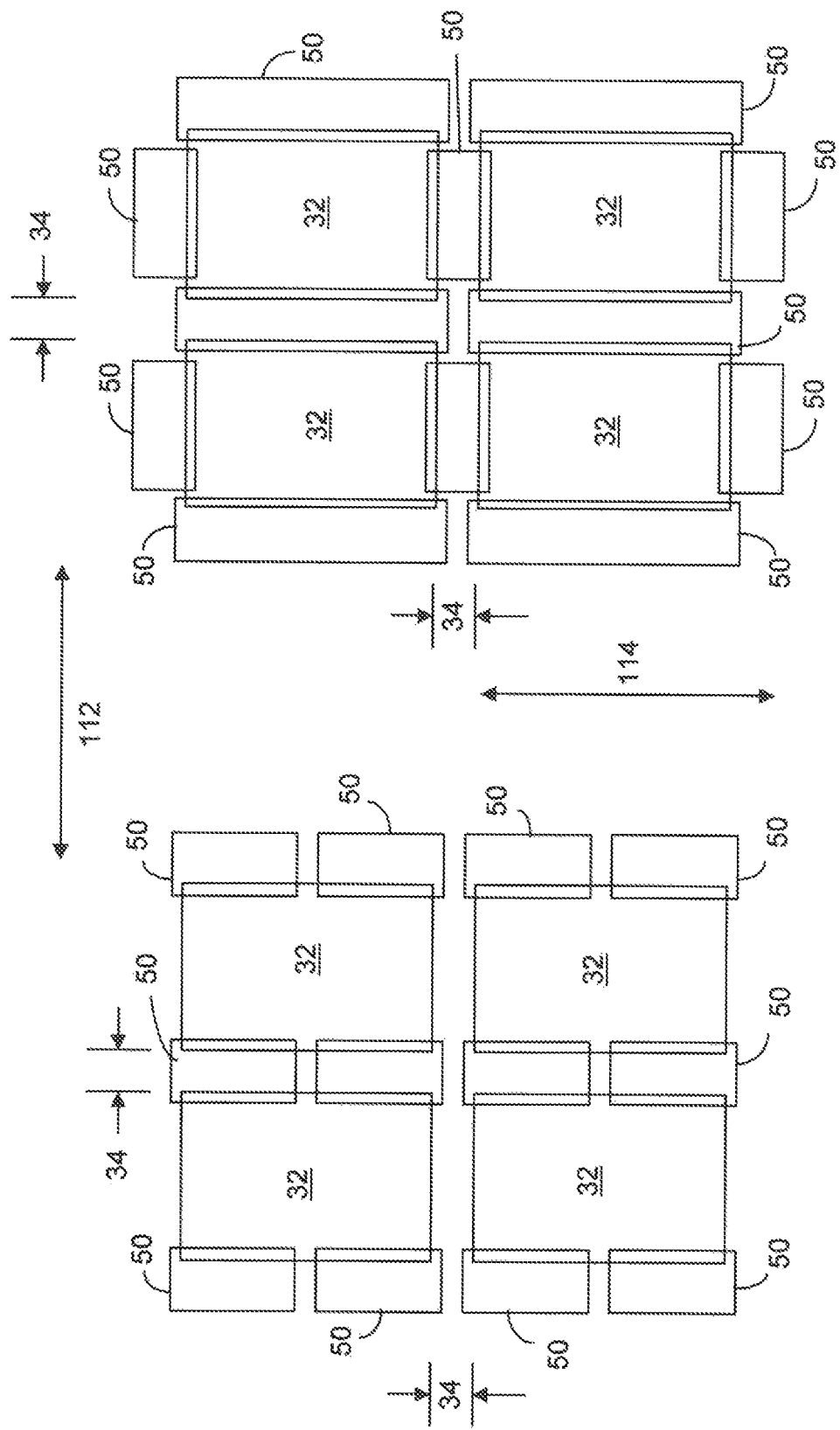

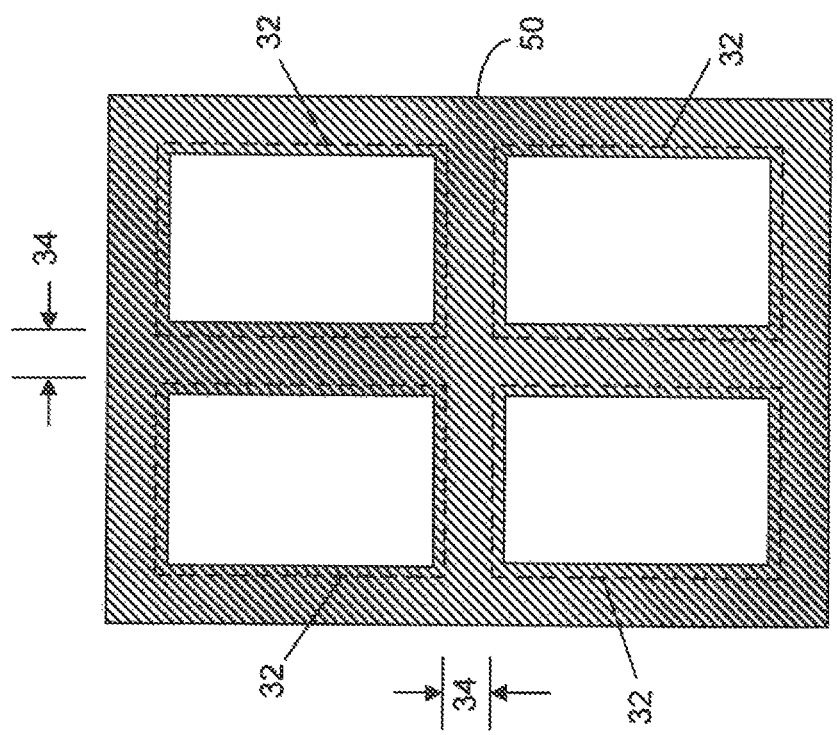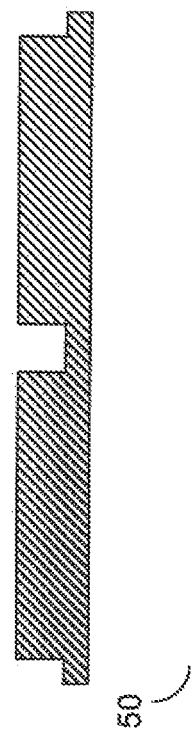

CURVED LCD DISPLAY DEVICE

TECHNICAL FIELD

The present invention relates generally to a liquid crystal display and, more specifically, to a curved liquid crystal display (LCD) panel.

BACKGROUND OF THE INVENTION

LCD TV is capable of delivering on a large screen a realistic, high-image quality viewing experience. However, on a large LCD panel, the image distortion near the edge and the low contrast ratio based on the viewing angles become an issue that requires attention. As a solution, the industry has come up with a curved display panel. A curved LCD panel offers an improved image quality as regard to the image distortion without sacrificing the contrast ratio.

An LCD panel has a CF substrate, a TFT substrate and a liquid crystal layer between the CF substrate and the TFT substrate. As illustrated in FIG. 2A, the TFT substrate 20 has a pixel electrode layer 21, a passivation layer 22, a plurality of data bus lines 23 and a gate insulator layer 24 to form a plurality of pixel areas 32 arranged in a two-dimensional array. The CF substrate 71 has common electrode layer 79 and a color filter layer 74 having a plurality of filter cells 75, 76, 77, each of which is corresponding to a pixel area 32. The pixel area and the corresponding filter cell are generally referred to as a pixel. The TFT substrate 20 also has a plurality of bordering areas 34 located between two adjacent pixel areas 32. It is desirable to have a pixel area as large as practically possible. That is, it is desirable to have the width of the bordering areas as small as possible.

In a color display, each pixel has three color sub-pixels. Each of the color sub-pixels has a different filter cell and a different pixel area. Each TFT pixel area is used to control the transmission of light through the liquid crystal layer 40 in the color sub-pixel. In order to prevent light in the bordering area or opening from leaking into neighboring filter cells, a masking element known as "BM" 72 is disposed between two adjacent filter cells. Ideally, the width of the masking element is substantially the same as the width of the bordering area 34. As such, the aperture 73 is optimal. When the masking element is in perfect alignment with the corresponding opening, the attainable contrast ratio of the display is also optimal.

In a flat screen TV, the spatial relationship between the filter cell and the corresponding pixel area is substantially the same regardless of the locations of the pixels. For example, on a flat screen TV as shown in FIG. 1A, the pixels at location A and the pixels at location B are practically identical.

In making a liquid crystal display, all of the component panels, especially the CF substrate and the TFT substrate, are firmly sealed so as to maintain the perfect alignment between the filter cell and the corresponding pixel area. When a flat screen display panel is bent to make a curved screen display panel, the CF substrate and the TFT substrate are bent together. Because the radius curvature of the CF substrate and the radius curvature of the TFT substrate in a curved display panel are slightly different, there would be a local shift between the filter cell and the corresponding pixel area. As a result, the masking element on the CF substrate may not be in perfect alignment with the corresponding opening on the TFT substrate. The amount of shift is dependent upon the locations of the pixels (see FIG. 1B). For example, while the pixels at location A may have no shift or the shift is negligible (see FIG. 2A), the shift S at location B might result in a substantial misalignment between the masking element and the corresponding opening. The misalignment may cause the light 113 transmitted through the bordering area to leak into a neighboring filter cell as shown in FIG. 2B. In order to eliminate or minimize the light leak due to the misalignment, a broader masking element 72' is used (see FIG. 2C). A broader masking element, however, results in a smaller aperture 73' and, therefore, a lower contrast ratio.

SUMMARY OF THE INVENTION

In a curved liquid crystal, the masking elements on the CF substrate are broader than the bordering areas or openings on the TFT substrate. Thus, each of the aperture areas on the CF substrate is smaller than the corresponding pixel area on the TFT substrate, reducing the contrast ratio of the display. The present invention provides a method and device for improving the contrast ratio in a curved liquid crystal display panel. More specifically, light directing elements with reflective surfaces are arranged between the CF substrate and the TFT substrate to direct part of the light beam transmitted through a pixel area toward the corresponding aperture area.

Thus, the first aspect of the present invention is a liquid crystal display comprising:
 a first substrate comprising a TFT layer;
 a second substrate, and
 a liquid crystal layer disposed between the first substrate and the second substrate, the TFT layer comprising a plurality of pixel areas, the second substrate comprising a plurality of aperture areas smaller than the pixel areas, each of the pixel areas located in relationship to a corresponding one of the aperture areas, said liquid crystal display further comprising
 a plurality of light directing elements located between the first substrate and the second substrate positioned in relationship to at least some of the pixel areas, the light directing elements having reflective surfaces configured to reflect part of a light transmitted through a pixel area to the corresponding aperture area.

According to an embodiment of the present invention, the first substrate is arranged to transmit the light through the TFT layer, to the liquid crystal layer and then to the second substrate, and the light transmitted through the TFT layer comprising a plurality of light beam segments, each light beam segment arranged to transmit through a different one of the pixel areas, and the light beam segment transmitted through a pixel area has a beam cross-section, and wherein the reflective surfaces of the light directing elements are arranged to condense at least a part of said light beam segment so as to reduce the beam cross-section of said light beam segment as said light beam segment reaches the corresponding aperture area.

According to an embodiment of the present invention, the second substrate further comprises a plurality of masking elements located between adjacent aperture areas, and wherein the light directing elements are disposed adjacent to the masking elements.

According to an embodiment of the present invention, wherein the TFT layer further comprises a plurality of bordering areas located between adjacent pixel areas, and wherein the light directing elements are disposed in relationship to the bordering areas.

According to an embodiment of the present invention, the liquid crystal layer has a layer thickness T, and each of the light directing elements has a height H, with H being smaller than T.

According to an embodiment of the present invention, the difference between T and H defines a gap G, with ¼T<G<½T.

According to an embodiment of the present invention, each of the light directing elements has an elongated body, and wherein the height of the light directing element at some part of the elongated body is greater than the height of the light directing element at another part of the elongated body.

According to an embodiment of the present invention, the light directing elements are disposed on the first substrate, leaving a gap between the light directing elements and the second substrate.

According to an embodiment of the present invention, the light directing elements are disposed on the second substrate, leaving a gap between the light directing elements and the first substrate.

According to an embodiment of the present invention, the pixel areas are arranged in a two-dimensional array of rows along a first direction and columns along a different second direction, and each of the pixel areas has a first length along the first direction and a second length along the second direction, and wherein each of the light directing elements has an elongated body located between adjacent columns substantially parallel to the second direction, wherein the elongated body has a length, and wherein the length can be greater than, substantially equal to, or smaller than the second length of the pixel areas.

According to an embodiment of the present invention, the pixel areas are arranged in a two-dimensional array of rows along a first direction and columns along a different second direction, and each of the pixel areas has a first length along the first direction and a second length along the second direction, and wherein each of the light directing elements has an elongated body located between adjacent rows substantially parallel to the first direction, wherein the elongated body has a length, and wherein the length can be greater than, substantially equal to, or smaller than the first length of the pixel areas.

According to an embodiment of the present invention, the pixel areas are arranged in a two-dimensional array of rows along a first direction and columns along a different second direction, and each of the pixel areas has a first length along the first direction and a second length along the second direction, and wherein each of the light directing elements has an elongated body, and wherein the elongated body of some of the light directing elements is arranged along the first direction and the elongated body of some of the light directing elements is arranged along the second direction.

According to an embodiment of the present invention, the second substrate comprises a color filter layer, the color filter layer comprising a plurality of filter cells, each filter cell corresponding to a color pixel of the liquid crystal display, wherein each filter cell has a cell area equal to the aperture area.

According to an embodiment of the present invention, each of the light directing elements comprises a core for disposing the reflective surface, the core having a base, and wherein the reflective surface and the base define an angle therebetween, and the angle is greater than 60 degrees, and smaller than or equal to 90 degree According to an embodiment of the present invention, each of the light directing elements has a cross sectional area, the cross sectional area having a dome shape.

According to an embodiment of the present invention, each of the light directing elements has a cross sectional area, the cross sectional area having a rectangular, trapezoidal or triangular shape.

According to an embodiment of the present invention, each of the light directing elements has a cross sectional area, the cross sectional area having a rectangle, or trapezoid shape with a round head.

According to an embodiment of the present invention, the liquid crystal display is a curved display.

The second aspect of the present invention is a method for use in a liquid crystal display, the liquid crystal display comprising:

a first substrate comprising a TFT layer;

a second substrate, and a liquid crystal layer disposed between the first substrate and the second substrate, the TFT layer comprising a plurality of pixel areas, the second substrate comprising a plurality of aperture areas corresponding to the pixel areas, wherein the first substrate is arranged to transmit light through the TFT layer, to the liquid crystal layer and then to the second substrate, the light transmitted through the TFT layer comprising a plurality of light beam segments, each light beam segment arranged to transmit through a different one of the pixel areas, wherein each light beam segment has a beam width, the method comprising providing a plurality of light directing elements located between the first substrate and the second substrate positioned in relationship to at least some of the pixel areas, the light directing elements having reflective surfaces configured to condense at least a part of the light beam segment transmitted through a pixel area to the corresponding aperture area.

According to an embodiment of the present invention, the light directing elements are disposed on the first substrate or on the second substrate.

The present invention will become apparent upon reading the description in conjunction with FIGS. 3 to 9.

BRIEF DESCRIPTION OF THE DRAWINGS

FIG. 1A illustrates a typical flat screen display panel.

FIG. 1B illustrates a typical curved screen display panel.

FIGS. 7A-7E illustrate various cross sectional shapes of the light directing elements.

FIGS. 8A-8G illustrate various arrangements of the light directing elements.

FIG. 9 illustrates the shape of a light directing element, according to an embodiment of the present invention.

DETAILED DESCRIPTION OF THE INVENTION

The present invention provides a method and device for improving the contrast ratio in a curved liquid crystal display panel. In particular, the present invention uses a plurality of light directing elements located between the CF substrate and the TFT substrate to effectively condense the light beam transmitted through a pixel area on the TFT substrate. The condensed light beam is arranged to transmit through the aperture on the CF substrate corresponding to the pixel area. As a result, the contrast ratio of the display panel is improved.

FIGS. 3, 4, 5, 5A and 6

Figure 2A:
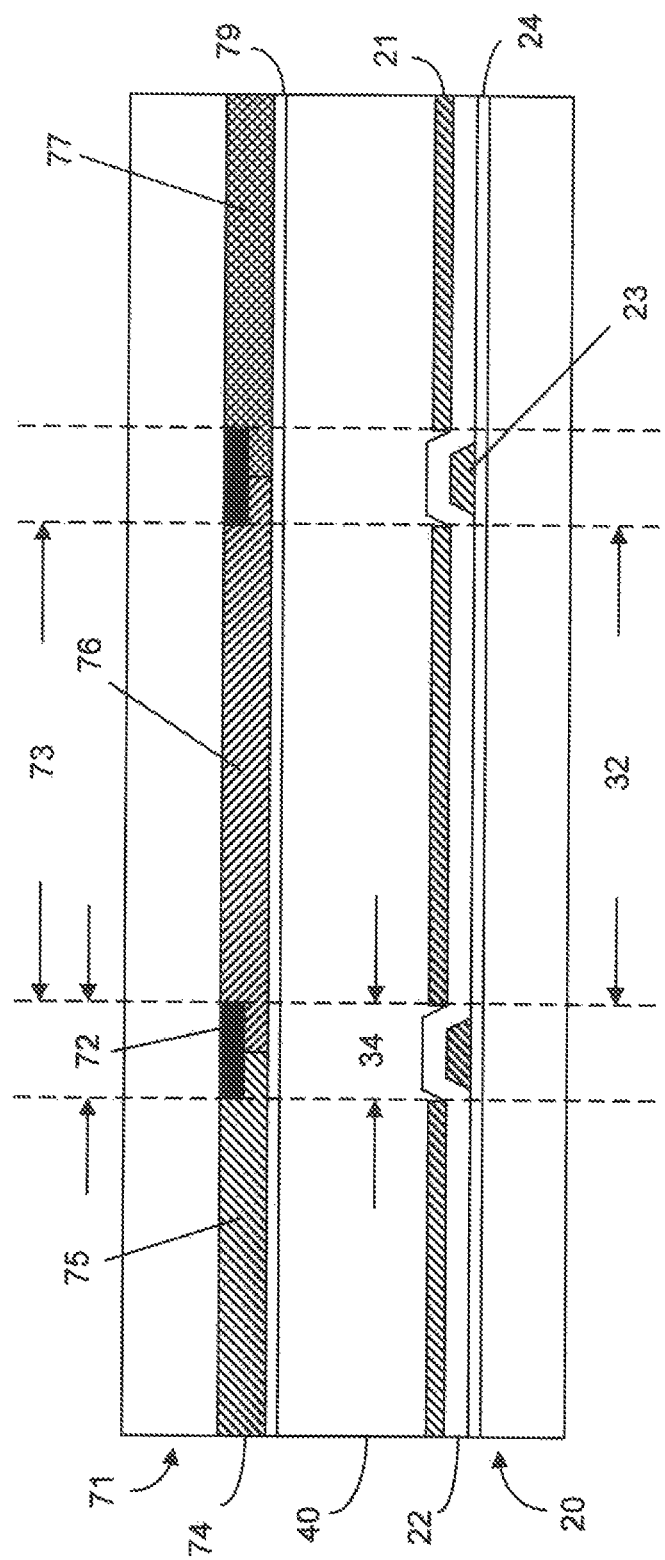
FIG. 2A illustrates the alignment between a masking element on the CF substrate and an opening on the TFT substrate.
Figure 2B:
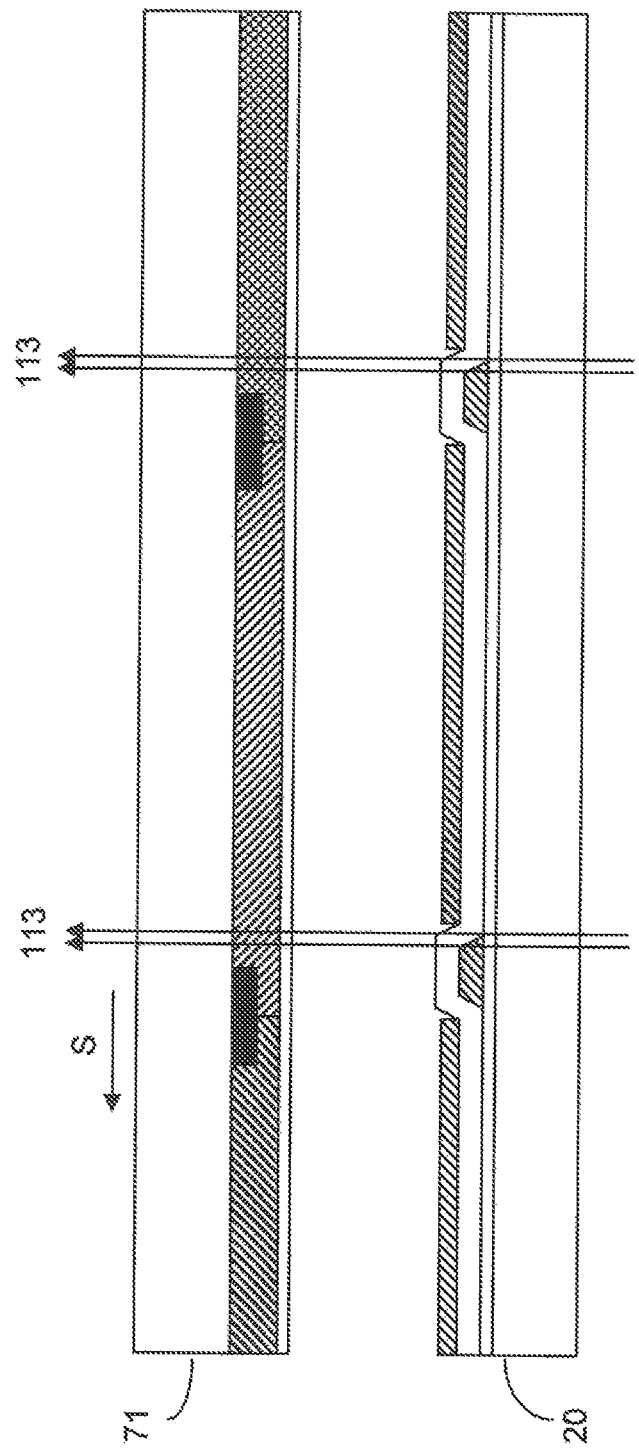
FIG. 2B illustrates the misalignment between a masking element on the CF substrate and an opening on the TFT substrate due to shifting between the two substrates.
Figure 2C:
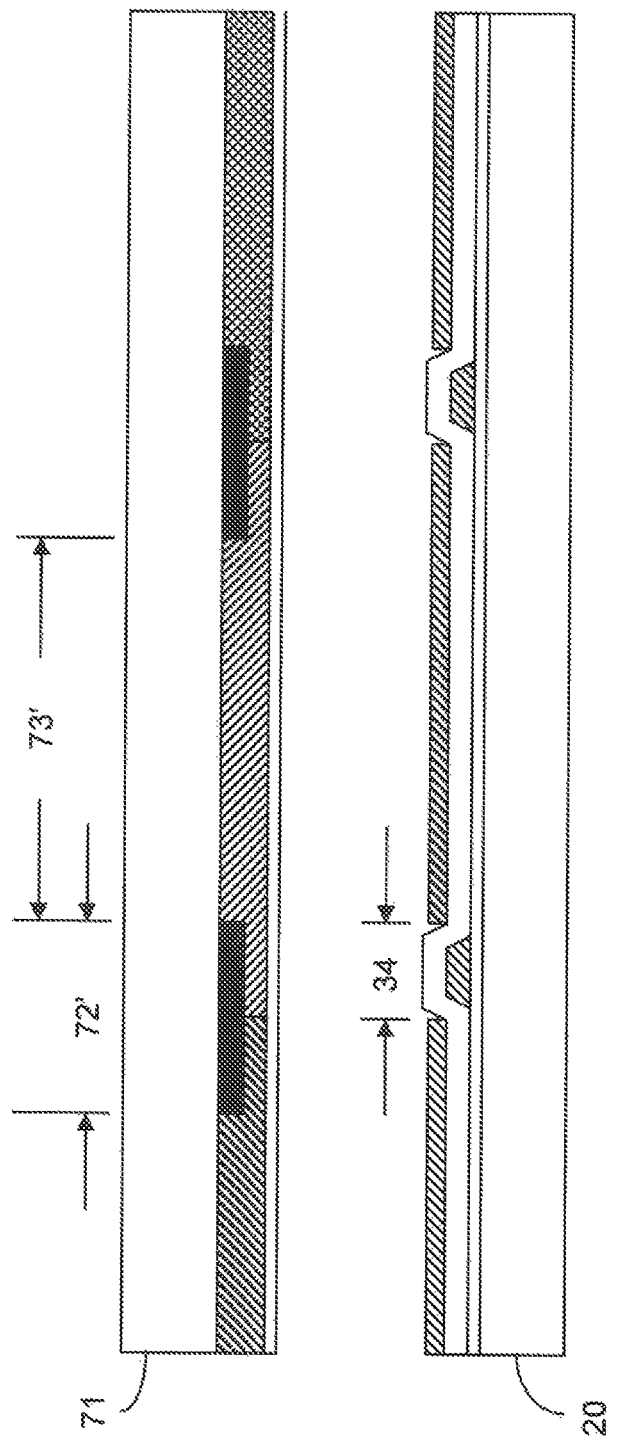
FIG. 2C illustrates a broader masking element on the CF substrate.
Figure 3:
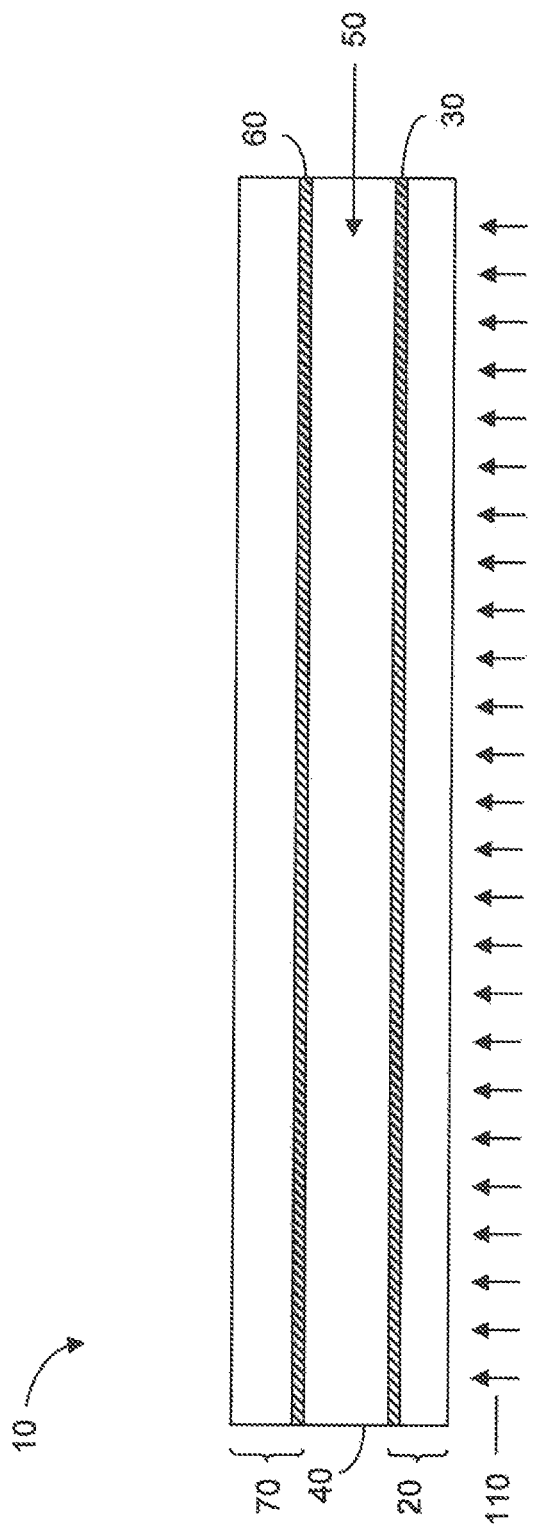
FIG. 3 illustrates a section of a liquid crystal display panel, according to an embodiment of the present invention.
Figure 4:
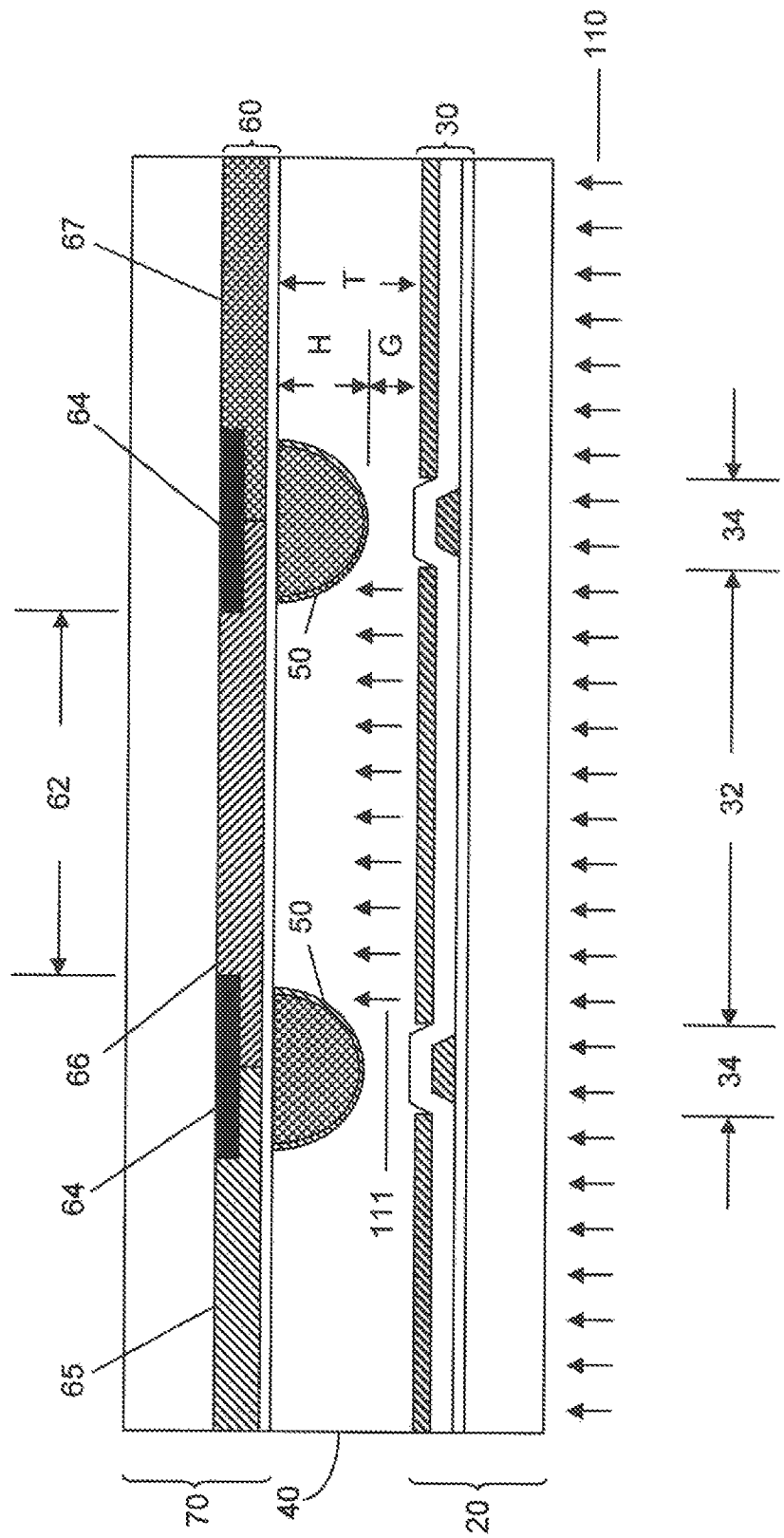
FIG. 4 illustrates the use of light directing elements in a liquid crystal display panel, according to an embodiment of the present invention.

As shown in FIGS. 3 and 4, the liquid crystal display 10 comprises a first substrate 20, a second substrate 70 and a liquid crystal layer 40 disposed between the first substrate 20 and the second substrate 70. The first substrate 20 comprises a TFT layer 30, which has a plurality of pixel areas 32. The second substrate 70 comprises a color filter layer 60 which comprises a plurality of aperture areas 62 corresponding to the pixel areas 32. The first substrate 20 is arranged to transmit light 110 through the TFT layer 30, to the liquid crystal layer 40 and then to the second substrate 70. The liquid crystal display 10 also comprises a plurality of light directing elements 50 disposed between the first substrate 20 and the second substrate 70.

In a color display, the color filter layer 60 has a plurality of filter cells 65, 66, 67 of different colors as shown in FIG. 4. The area of each of the filter cells 65, 66, 67 defines the aperture area 62. The color filter layer 60 also has a plurality of masking elements 64 disposed between adjacent filler cells. In the TFT layer 30, adjacent pixel areas 32 are separated by a bordering area 34. As each of the aperture areas 62 has a corresponding pixel area 32, each of the masking elements 64 has a corresponding bordering area 34. The masking elements 64 are arranged to prevent light transmitted through the corresponding bordering areas 34 from leaking into neighboring filter cells.

As shown in FIG. 4, the light 110 transmitted through the TFT layer 30 has a plurality of light beam segments 111 (only one segment is shown), each light beam segment 111 arranged to transmit through a different one of the pixel areas 32. As seen in FIG. 4, the aperture area 62 is smaller than the pixel area 32. This means that part of the light beam segment 111 transmitted through a pixel area 32 will not get through the corresponding aperture area 62. In other words, part of the light beam segment 111 will be lost. According to an embodiment of the present invention, two light directing elements 50 disposed in relationship to the pixel area 32 are used to direct part of the light beam segment 111 toward the corresponding aperture area 62 (see FIGS. 5 and 5A). The light directing elements 50 are located between the first substrate 20 and the second substrate 70. Each of the light directing elements 50 is located above a bordering area 34.

According to an embodiment of the present invention, each of the light directing elements 50 has a height H, which is smaller than the thickness T of the liquid crystal layer 40. As seen in FIG. 4, the light directing elements 50 are disposed on the second substrate 70, leaving a gap G between the light directing elements 50 and the first substrate 20. The gap G allows the liquid crystal in the liquid crystal layer 40 to flow during the liquid crystal injection stage.

Figure 5:
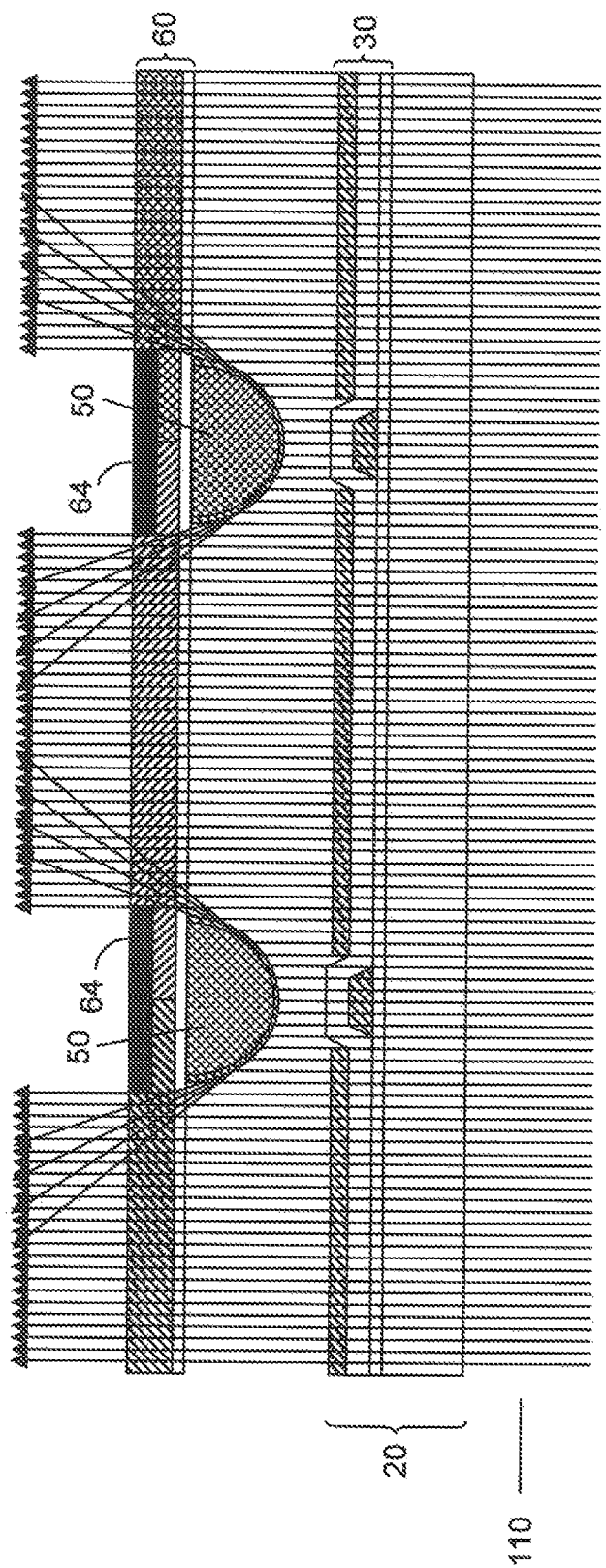
FIG. 5 illustrates the reflection of light by the light directing elements in the liquid crystal display panels, according to an embodiment of the present invention.

As illustrated in FIG. 5, the light directing elements 50 have reflective surfaces 52 (see 7A-7E) configured to condense at least a part of the light 110 after the light 110 is transmitted through the pixel areas 32.

Figure 5A:
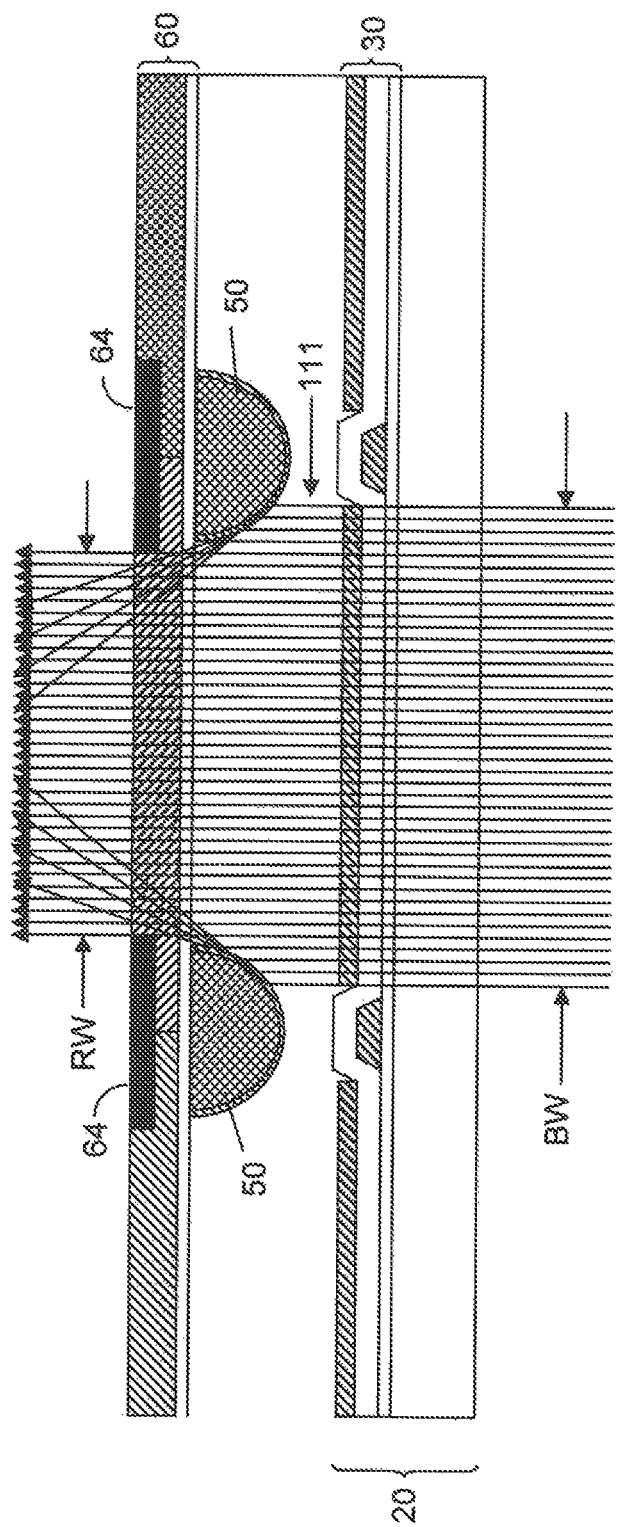
FIG. 5A illustrates the condensing of a light beam that is transmitted through a pixel area by the light directing elements.

FIG. 5A illustrates the condensing of a light beam segment 111 by the light directing elements 50. As shown in FIG. 5A, the cross section BW of the light beam segment 111 transmitted through a pixel area 32 (FIG. 4) is substantially the same as the pixel area 32. A part of the light beam segment 111 is reflected by the light directing elements 50 toward the corresponding aperture area 62 (FIG. 4). As the light beam segment 111 reaches the aperture area 62, its cross section is reduced to RW.

Figure 6:
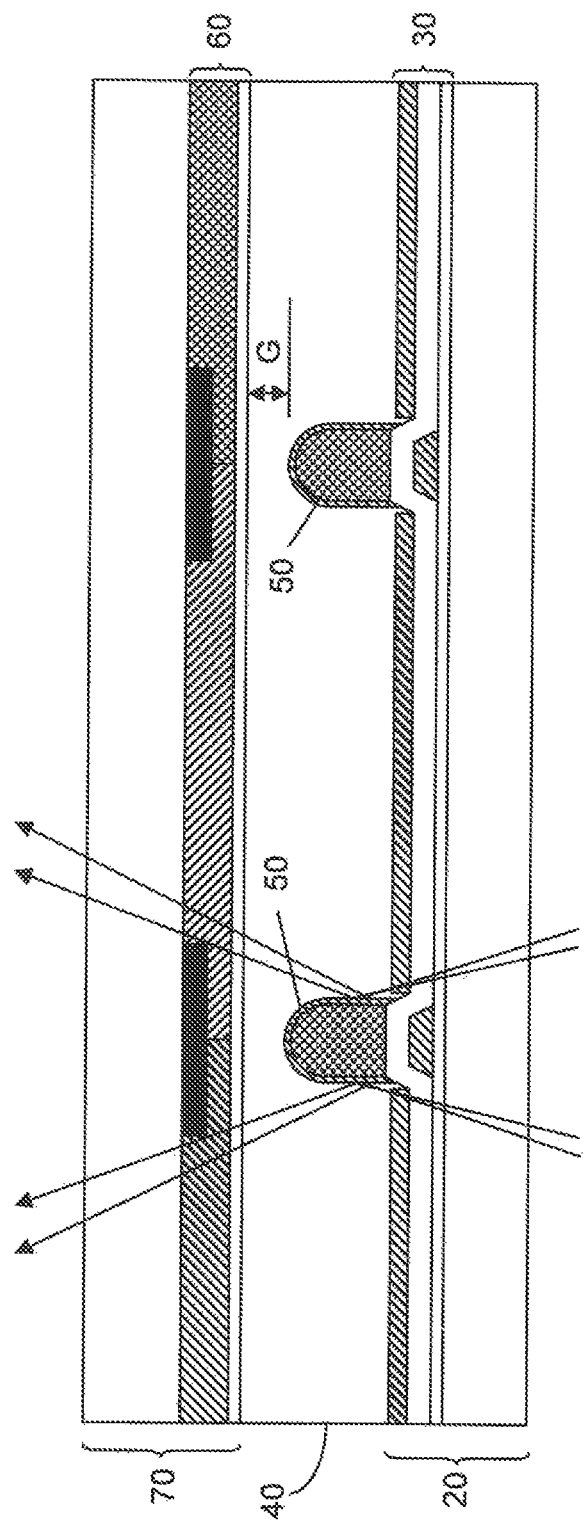
FIG. 6 illustrates the use of light directing elements, according to an embodiment of the present invention.

According to an embodiment of the present invention, the light directing elements 50 are disposed on the first substrate 20, leaving a gap G between the light directing elements 50 and the second substrate 70 as shown in FIG. 6.

According to an embodiment of the present invention, the gap G as shown in FIGS. 4 and 6 can be ranged from ¼ to ½ of the thickness of the liquid crystal layer 40.

FIGS. 7A-7E

According to the present invention, the light directing elements 50 can have different shapes. It is understood that, the shapes as shown in FIGS. 7A-7E are the shapes of the cross sections of the light directing elements 50. As seen in FIGS. 7A-7E, each light directing element 50 has a core 54 and a reflective surface 52. The cross section of the light directing element 50 can be like a dome as shown in FIG. 7A. The cross section of the light directing element 50 can be like a trapezoid as shown in FIG. 7B. The cross section of the light directing element 50 can be like a triangle as shown in FIG. 7C. The cross section of the light directing element 50 can be like a rectangle with a round top as shown in FIG. 7D. The cross section of the light directing element 50 can be like a trapezoid with a round top as shown in FIG. 7E As shown in FIGS. 7A-7B, each of the light directing elements 50 has a core 54 for disposing a reflective surface 52 and a base 58. In FIG. 7A, the reflective surface 52 is curved, and the angle $\theta$ between the reflective surface 52 and the base 58 is greater than 60 degrees, and smaller than or equal to 90 degree. In FIG. 7D, the angle between the reflective surface 52 and the base 58 is substantially equal to 90 degrees. In FIGS. 7B, 7C and 7E, the reflective surface 52 has two straight walls with a taper angle $\theta$ between each wall and the base 58. According to an embodiment of the present invention, the taper angle $\theta$ is greater than 60 degrees, and smaller than or equal to 90 degree. According to an embodiment of the present invention, the width of the base 58 is smaller than or equal to the width of the masking elements 64 (see FIG. 4). With the angle $\theta$ between the reflective surface 52 and the base being greater than 60 degrees, and smaller than or equal to 90 degree.

According to an embodiment of the present invention, the core 54 can be made from an organic polymer and the reflective surface 52 can be a coating of high-reflectance metal, such as Ag, Al, Mo and Ti, or high-reflectance metal alloy. According to an embodiment of the present invention, the core 54 can also be made of a metal or metal alloy. The core 54 and the reflective surface 52 can be made of the same high-reflectance metal or alloy.

FIGS. 8A-8G and 9

Figure 8F:
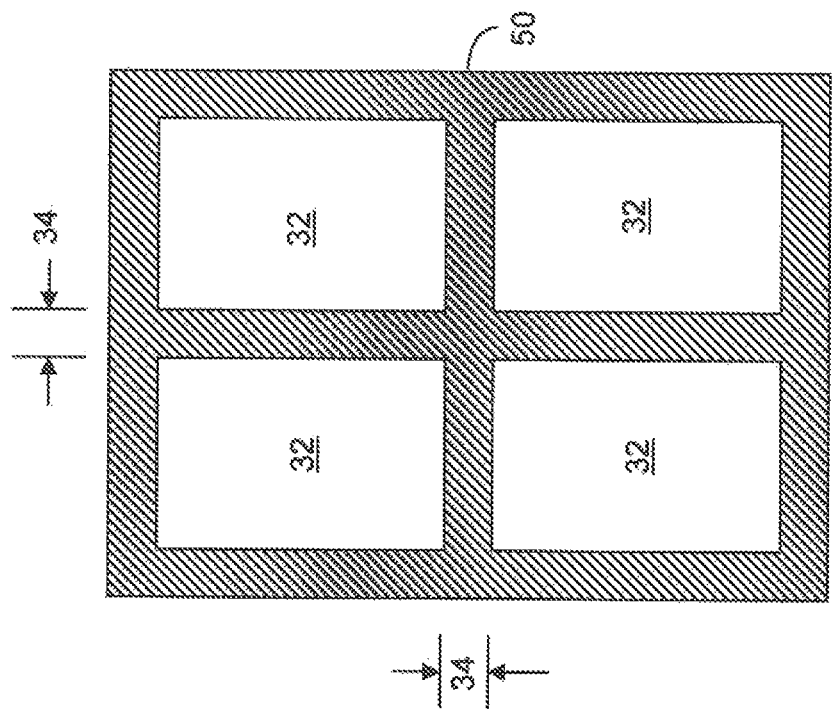
Figure 8E:
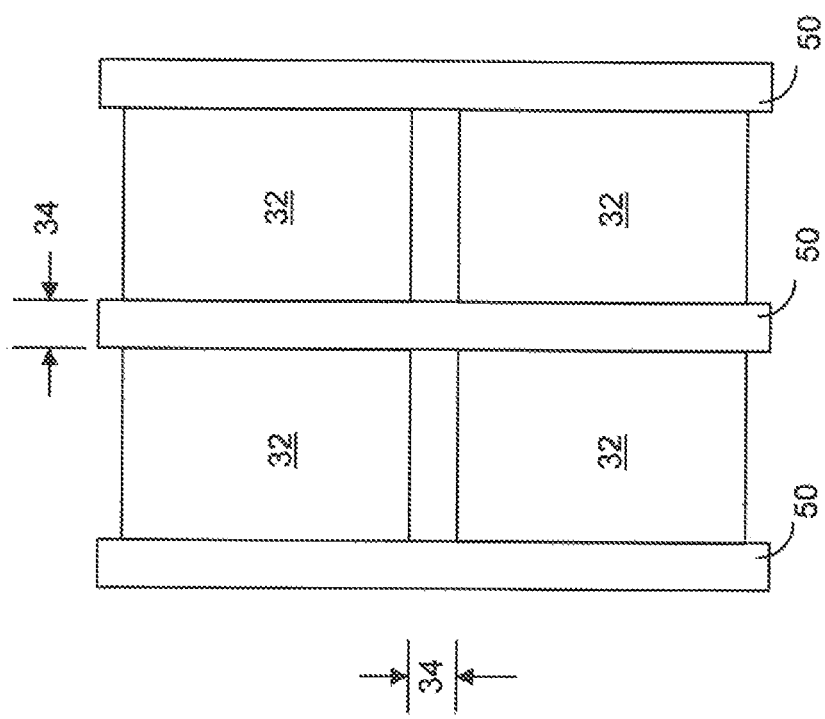

In general, each of the light directing elements 50 has a substantially straight, elongated body as it is arranged to be disposed in relationship to the bordering area between adjacent pixel areas. As shown in FIGS. 8A-8D, the pixel areas 32 in a liquid crystal display panel are arranged in a two dimensional array consisting of rows and columns. The rows are arranged along direction 112 and the columns are arranged along direction 114. The light directing elements 50 are located in relationship to the pixel areas 32 as shown in FIG. 4 or FIG. 6. According to an embodiment of the present invention, each of the light directing elements 50 is arranged in the column direction 114, covering the length of a plurality of pixel areas 32 as shown in FIG. 8A. According to an embodiment of the present invention, each of the light directing elements 50 substantially covers the length of a pixel area 32 as shown in FIG. 8B. According to an embodiment of the present invention, two or more light directing elements 50 cover the length of a pixel area 32 as shown in FIG. 8C. According to an embodiment of the present invention, light directing elements 50 are arranged in both the row direction 112 and the column direction 114 as shown in FIG. 8D. In FIGS. 8A and 8D, the width of the light-directing elements 50 is greater than the width of the bordering area 34 (see FIG. 4, for example). In an embodiment of the present invention, the width of the light-directing elements 50 is substantially equal to the width of the bordering area 34 as shown in FIGS. 8E and 8F (see FIG. 6, for example). In the embodiment as shown in FIG. 8F, the light-directing element 50 (shaded area) takes the shape of a two-dimensional frame, with the width of the light-directing element 50 being substantially the same as the width of the bordering area 34. In the embodiment as shown in FIG. 8G, the light-directing element 50 (shaded area) takes the shape of a two-dimensional frame, with the width of the light-directing element 50 being greater than the width of the bordering area 34. As shown in FIGS. 8A-8E, each of the light directing elements 50 can be a long and continuous body. But it can also be composed of discrete segments.

As shown in FIGS. 8A-8D, the pixel areas 32 are arranged in a two-dimensional array of rows along a first direction 112 and columns along a different second direction 114, each of the pixel areas has a first length along the first direction and a second length along the second direction. According to an embodiment of the present invention, each of the light directing elements 50 has an elongated body located between adjacent columns substantially parallel to the second direction, wherein the elongated body has a length greater than the second length of the pixel areas 32. According to another embodiment of the present invention, each of the light directing elements 50 has an elongated body located between adjacent columns substantially parallel to the second direction, wherein the elongated body has a length substantially equal to or smaller than the second length of the pixel areas 32. According to a different embodiment of the present invention, each of the light directing elements 50 has an elongated body located between adjacent rows substantially parallel to the first direction, wherein the elongated body has a length greater than the first length of the pixel areas 32. According to yet another embodiment of the present invention, each of the light directing elements 50 has an elongated body substantially parallel to the first direction, located between adjacent rows, wherein the elongated body has a length substantially equal to or smaller than the first length of the pixel areas 32.

According to an embodiment of the present invention, each of the light directing elements 50 has an elongated body with a height H (FIG. 4). The height H can be substantially uniform throughout the elongated body. According to an embodiment of the present invention, the height H can also be non-uniform. For example, the height H of the light directing element 50 at some part of the elongated body is greater than the height of the light directing element 50 at another part of the elongated body as shown in FIG. 9. Since a smaller height H makes a wider gap G, the difference in the height H of the light directing elements 50 would make the flow of the liquid crystal easier during the liquid crystal injection stage.

It is understood that the shapes and sizes of the light directing elements 50 as shown are for illustrative purposes only. The purpose of having the light directing elements 50 between the first substrate and the second substrate is to direct part of the light beam transmitted through a pixel area toward the corresponding aperture. The light directing elements 50 can be used in a curved liquid crystal display. They can also be used in a flat-screen liquid crystal display.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:
1. A liquid crystal display comprising:
a first substrate comprising a TFT layer;
a second substrate, and
a liquid crystal layer disposed between the first substrate and the second substrate, the TFT layer comprising a plurality of pixel areas, the second substrate comprising a plurality of aperture areas smaller than the pixel areas, each of the pixel areas located in relationship to a corresponding one of the aperture areas, said liquid crystal display further comprising
a plurality of light directing elements located between the first substrate and the second substrate positioned in relationship to at least some of the pixel areas, the light directing elements having reflective surfaces configured to reflect part of a light transmitted through a pixel area to the corresponding aperture area, wherein the pixel areas are arranged in a two-dimensional array of rows along a first direction and columns along a different second direction, and wherein each of the light directing elements has an elongated body substantially parallel to the second direction, each of the light directing element having a height, wherein the height of the light directing element at some part of the elongated body is greater than the height of the light directing element at another part of the elongated body.
2. The liquid crystal display according to claim 1, wherein the first substrate is arranged to transmit the light through the TFT layer, to the liquid crystal layer and then to the second substrate, and the light transmitted through the TFT layer comprising a plurality of light beam segments, each light beam segment arranged to transmit through a different one of the pixel areas, and the light beam segment transmitted through a pixel area has a beam cross-section, and wherein the reflective surfaces of the light directing elements are arranged to condense at least a part of said light beam segment so as to reduce the beam cross-section of said light beam segment as said light beam segment reaches the corresponding aperture area.

3. The liquid crystal display according to claim 1, wherein the second substrate further comprises a plurality of masking elements located between adjacent aperture areas, and wherein the light directing elements are disposed adjacent to the masking elements.

4. The liquid crystal display according to claim 1, wherein the TFT layer further comprises a plurality of bordering areas located between adjacent pixel areas, and wherein the light directing elements are disposed in relationship to the bordering areas.

5. The liquid crystal display according to claim 1, wherein the liquid crystal layer has a layer thickness T, and the height of each of the light directing elements is H, with H being smaller than T.

6. The liquid crystal display according to claim 5, wherein a difference between T and H defines a gap G, with $\frac{1}{4}T<G<\frac{1}{2}T$.

7. The liquid crystal display according to claim 1, wherein the light directing elements are disposed on the first substrate, leaving a gap between the light directing elements and the second substrate.

8. The liquid crystal display according to claim 1, wherein the light directing elements are disposed on the second substrate, leaving a gap between the light directing elements and the first substrate.

9. The liquid crystal display according to claim 1, wherein each of the pixel areas has a first length along the first direction and a second length along the second direction, each of the light directing elements located between adjacent columns, wherein the elongated body has a length greater than the second length of the pixel areas.

10. The liquid crystal display according to claim 1, wherein each of the pixel areas has a first length along the first direction and a second length along the second direction, each of the light directing elements located between adjacent columns, wherein the elongated body has a length substantially equal to or smaller than the second length of the pixel areas.

11. The liquid crystal display according to claim 1, wherein each of the pixel areas has a first length along the first direction and a second length along the second direction, and wherein the elongated body has a length greater than the first length of the pixel areas.

12. The liquid crystal display according to claim 1, wherein each of the pixel areas has a first length along the first direction and a second length along the second direction, and wherein the elongated body has a length substantially equal to or smaller than the first length of the pixel areas.

13. The liquid crystal display according to claim 1, wherein the pixel areas are arranged in a two-dimensional array of rows along a first direction and columns along a different second direction, and each of the pixel areas has a first length along the first direction and a second length along the second direction, and wherein each of the light directing elements has an elongated body, and wherein the elongated body of some of the light directing elements is arranged along the first direction and the elongated body of some of the light directing elements is arranged along the second direction.

14. The liquid crystal display according to claim 1, wherein the second substrate comprises a color filter layer, the color filter layer comprising a plurality of filter cells, each filter cell corresponding to a color pixel of the liquid crystal display, wherein each filter cell has a cell area equal to the aperture area.

15. The liquid crystal display according to claim 1, wherein each of the light directing elements comprises a core for disposing the reflective surface, the core having a base, and wherein the reflective surface and the base define an angle therebetween, and the angle is greater than 60 degrees, and smaller than or equal to 90 degree.

16. The liquid crystal display according to claim 1, wherein each of the light directing elements has a cross sectional area, the cross sectional area having a dome shape, or having a rectangle, or trapezoid shape with a round head.

17. The liquid crystal display according to claim 1, wherein each of the light directing elements has a cross sectional area, the cross sectional area having a rectangular, trapezoidal or triangular shape.

18. The liquid crystal display according to claim 1, wherein the liquid crystal display is a curved display.

19. A liquid crystal display comprising:
a first substrate comprising a TFT layer;
a second substrate, and
a liquid crystal layer disposed between the first substrate and the second substrate, the TFT layer comprising a plurality of pixel areas, the second substrate comprising a plurality of aperture areas smaller than the pixel areas, each of the pixel areas located in relationship to a corresponding one of the aperture areas, said liquid crystal display further comprising
a plurality of light directing elements located between the first substrate and the second substrate positioned in relationship to at least some of the pixel areas, the light directing elements having reflective surfaces configured to reflect part of a light transmitted through a pixel area to the corresponding aperture area, wherein the pixel areas are arranged in a two-dimensional array of rows along a first direction and columns along a different second direction, and each of the pixel areas has a first length along the first direction and a second length along the second direction, and wherein each of the light directing elements has an elongated body located between adjacent columns substantially parallel to the second direction, wherein the elongated body has a length smaller than the second length of the pixel areas.

20. A liquid crystal display comprising:
a first substrate comprising a TFT layer;
a second substrate, and
a liquid crystal layer disposed between the first substrate and the second substrate, the TFT layer comprising a plurality of pixel areas, the second substrate comprising a plurality of aperture areas smaller than the pixel areas, each of the pixel areas located in relationship to a corresponding one of the aperture areas, said liquid crystal display further comprising
a plurality of light directing elements located between the first substrate and the second substrate positioned in relationship to at least some of the pixel areas, the light directing elements having reflective surfaces configured to reflect part of a light transmitted through a pixel area to the corresponding aperture area, wherein the pixel areas are arranged in a two-dimensional array of rows along a first direction and columns along a different second direction, wherein each of the light directing elements has an elongated body located between adjacent rows substantially parallel to the first direction.

\* \* \* \* \*